United States Patent [19]

Hutchison et al.

[11] 4,104,700

[45] Aug. 1, 1978

[54] HEAT PIPE COOLING FOR SEMICONDUCTOR DEVICE PACKAGING SYSTEM

[75] Inventors: Robert V. Hutchison, Oceanside; Peter P. Gregg, Vista; James J. MacBride, Carlsbad, all of Calif.

[73] Assignee: Burroughs Corporation, San Diego, Calif.

[21] Appl. No.: 764,064

[22] Filed: Jan. 31, 1977

[51] Int. Cl.$^2$ ............................................. H02B 1/00
[52] U.S. Cl. .................................. 361/384; 361/388
[58] Field of Search ............... 361/381, 383, 384, 385, 361/386, 388, 389, 392, 393, 412, 413, 415, 416; 357/81, 82

[56] References Cited

U.S. PATENT DOCUMENTS

| | | | |
|---|---|---|---|
| 3,213,324 | 10/1965 | McAdam | 361/388 |
| 3,518,493 | 6/1970 | Bathrick, Jr. et al. | 361/388 |
| 3,946,276 | 3/1976 | Braun et al. | 361/385 |

Primary Examiner—J D Miller
Assistant Examiner—Peter S. Wong
Attorney, Agent, or Firm—Joseph R. Dwyer; Mervyn L. Young; Kevin R. Peterson

[57] ABSTRACT

A system for cooling high density integrated circuits for computer systems comprising a cooling frame having a plurality of the heat pipes spanning the space within the frame to which sub-islands are attached to form an island. Each sub-island comprises a printed circuit board on which are mounted connectors for mounting the integrated circuit package and printed circuit board heat sinks having posts which cooperate with hold down pressure clamps for clamping the integrated circuit packages into the connectors and to clamp the heat sink plates of the integrated circuit packages to the printed circuit board heat sinks. These posts also aid in clamping the sub-islands together by cooperating a heat pipe hold down clamp by which each sub-island is clamped to the frame and to the heat pipes both mechanically and thermally to maximize the heat transfer between the integrated circuit packages and the heat pipes. The condenser end of the heat pipes extends into a plenum chamber through which air is circulated so that the heat generated by the integrated circuit packages ultimately dissipated in the ambient air.

Utilization of heat pipes maintains the integrated circuit packages at a uniformly low temperature and in the preferred embodiment, each sub-island is modular and can be connected or disconnected from the frame as a unit for testing, repairing and/or replacement without disconnecting or dismantling any other sub-island or the island can be operated with less than full complement of sub-islands.

16 Claims, 11 Drawing Figures

HEAT PIPE COOLING FOR SEMICONDUCTOR DEVICE PACKAGING SYSTEM

CROSS REFERENCE TO RELATED APPLICATION

To the extent that the present invention involves integrated circuits which may be packaged in the manner described and claimed in U.S. application Ser. No. 465,678, now a continuation U.S. application Ser. No. 666,099, for "Leadless Ceramic Package For Integrated Circuit Having Heat Sink Means" by Robert S. Morse, such continuation Application is referenced herein. This co-pending continuation application is assigned to the same assignee as the present application.

BACKGROUND OF THE INVENTION

1. Field of the Invention

This invention relates, in general, to MSI and LSI technology wherein high density integrated circuits are packaged and utilized in high speed data processing systems and relates, in particular, to the provision of sufficient cooling of such high density integrated circuit packages to maximize the capabilities of such MSI and LSI circuits.

2. Description of the Prior Art

As explained in detail in the U.S. Pat. No. 3,946,276 issued to Braun et al on Mar. 23, 1976, entitled, "Island Assembly Employing Cooling Means for High Density Integrated Circuit Packaging" and assigned to the assignee of this present application, present high speed computer systems require high density integrated circuits and a packaging technology to fully exploit the capabilities of such circuits. As shown and described in the subject patent, a plurality of pluggable integrated circuit (I.C.) packages, receptacles or connectors for receiving such packages, and interconnecting media were mounted on a cooling frame to form an "island." This island was made, more specifically, of a plurality of I.C. packages of the leadless variety, having a conductor metallization on an insulated carrier and an integrated heat sink plate, which were placed in the connectors positioned on a supporting medium, such as a printed circuit (p.c.) board, and pressed down by suitable clamps against the p.c. board and against the contacts in the connectors to make the electrical connection with other circuitry. These clamps also engaged a bracket which formed part of a cooling frame, and the I.C. packages, interconnecting medium, and connectors were supported thereon. This frame incorporated a hollow continuous tubing, arranged in a serpentine manner, through which a liquid coolant was pumped to carry away the heat generated by the I.C. packages. Heat transfer was accomplished by permitting the metal heat sink plates to make thermal contact with the metallic cooling frame.

While the foregoing described patented island assembly and cooling system thereof solved the basic problem of cooling high powered high density IC packages which could no longer be sufficiently cooled by moving air as conventionally done theretofore, it has been found that the system could be improved in a number of ways and it is, therefore, the main objects of this invention to:

1. Provide a means for effectively managing the heat generated by such high powered high density MSI and LSI chips so as to be usable in high performance circuits, such as in a current mode logic system, 2. To do this with maximum reliability, and 3. To do this cost effectively.

Meeting the foregoing objects, a primary improvement over the patent invention lies in elimination of the pump for pumping the liquid coolant, the serpentine tubing, heat exchangers for cooling the liquid, and all other equipment necessary for a somewhat typical refrigeration circulation system with attendant problems, such as leakage especially at the interconnections between the cooling system and the island frame, problems of corrosion with liquid flowing within metallic tubing etc, and vibration attendant to the pumping of liquid coolant through a frame such as in the prior art. It also must be realized that in a system with a plurality of islands, each island must be provided with a quick disconnect coupling so that an island can be withdrawn and replaced if necessary without the entire system being down and these quick disconnects are costly. This improvement was accomplished by the introduction of heat pipes into the cooling frame. These heat pipes, forming a structural member of the frame, serves to dissipate the heat generated by these I.C. packages without all of the aforementioned equipment necessary for liquid cooling. In this invention the heat pipe itself collects the heat and moves it by change of phase without motors or pumping equipment or fittings or otherwise and being a change of phase type operation, it is the most effective transfer of heat possible localized on each island with no loss of efficiency through mechanical motion and obviates the need for many moving parts which increases system reliability, reduces periodic maintenance and offers hardware cost savings in that the heat pipe plus the frame is less than the heat pipe plus the tubing motors, etc.

Finally, one more advantage of the present invention over the prior art in the utilization of the heat pipes with the localized air flow cooling thereof gives the system increased flexibility in that a heat pipe island containing current mode logic devices as a unit can be easily connected to an existing air cooled system by simply connecting the island to the existing air flow system, since there is no water pump, no external blower systems, etc. required.

Another improvement is the introduction of a modularity concept of sub-islands, together forming an island, yet without sacrificing I.C. packaging density. This modularity permits the removal and testing of only a portion of an entire island and a replacement of some portion thereof, if necessary, without removing the entire assembly. Perhaps the most important factor is the cost saving aspect of the modularity concept in connection with testing is the time involved. It takes less time to satisfactorily test, for example, six modules each containing a given number of IC packages then it does to test the same total (given number X 6) of IC packages on a large island board.

The introduction of the modularity concept reduces hardware costs in the event a full island is not required and secondly, the modularity increases the total yield of P.C. boards in that a defect in a large board requiring its rejection is more costly than a defect in a small board. Thus, as for example, its more cost effective to utilize six small P.C. boards than to utilize one large board as in the case of the prior art. It can also be appreciated that utilization of smaller P.C. boards allows freedom to partition into standardized modules, as for example, standardizing a module of input/output electronics to interface with peripheral equipment which may never need changing whereas the rest of the island may be subject to change depending upon customer needs. Thus, it should be clear that modularity does not simply mean cutting one large island into a number of sub-islands but modularity means taking advantage of a number of possibilities such as standardization (and theretofore a mass production cost reduction) of parts of the heretofore larger board.

Going further, with the introduction of the modularity concept, another improvement becomes apparent and that is in the means for clamping the I.C. packages into their connectors. These clamps remain latched even though one of the sub-islands is disconnected from the cooling frame so that removal of one of the sub-islands from the cooling frame does not in any way affect the relationship of the I.C. packages and their respective connectors. This, of course, means, as aforesaid, that any sub-island is capable of being removed as an integrated unit, repaired and/or tested and replaced without disturbing the other sub-islands.

Still another improvement over the patented invention lies in the aforesaid means for clamping the I.C. packages into their respective connectors. In the patented invention, first of all, the connectors for pressing the I.C. packages into the connectors formed part of, or were attached to, the cooling frame. The patented clamping means were attached at one end and pivoted about one portion of the cooling frame and locked into an adjacent portion of the cooling frame. This pivotal movement introduced a rubbing, albeit minute, of the I.C. package against the connector, but when one considers that the leads for the I.C. packages and the connectors are relatively thinly plated, this rubbing contact had a tendency to damage the connections and thus led to the possibility of an open connection between the I.C. package and the leads of the connector.

Thus, a concomitant improvement in the present invention is in the clamping means for clamping the I.C. packages into the connector in that the pressure actuated by the clamping means is in one direction only, i.e., downward, against the top surface of the I.C. packages to avoid the aforementioned rubbing or sliding effect on the contacts.

Also, with the introduction of the modularity concept and the heat pipes, still another improvement lies in a second clamping means for clamping the sub-island to the heat pipes and frame. This clamping means is independent of the aforesaid IC package clamping means and is simple to operate, utilizing only a screw driver or similar tool to latch and unlatch the sub-islands from the heat pipes.

This second clamping means, too, is a significant improvement over the prior art in that the clamp means first of all eliminates the screw attachment requirements of the patented invention where the P.C. board was attached by screws to the frame sections but secondly, the fact that this clamping means, being integral, eliminates the possibility of loose parts accidentially dropping onto the I.C. packages and conductors causing a short circuit and possible damage to the components of the system.

Other improvements over the prior art will become apparent to those skilled in the art after a study of the following summary and description of the preferred embodiment.

SUMMARY OF THE INVENTION

This invention improves the prior art by the provision of a cooling frame or supporting carrier for a plurality of the heat pipes attached thereto and spanning the space within the frame. A plurality of sub-islands are attached to the cooling frame to form an island. Each sub-island comprises a printed circuit (p.c.) board of the conventional type on which are mounted a plurality of connectors in parallel relationship and electrically connected to interconnect circuitry leads printed on the circuit board. The sub-island circuit board is also provided with a plurality of p.c. board heat sinks in the form of metallic strips, also spaced apart in parallel relationship abutting the ends of the connectors. These p.c. board heat sinks are also provided with a plurality of uprights or posts also spaced apart a distance sufficient to accomodate the integrally formed heat sinks of individual integrated circuit (I.C.) packages.

These posts cooperate with a plurality of hold down pressure clamps for clamping the I.C. packages into the connectors for the dual purpose of providing an electrical connection to the connector and to clamp the heat sink plates of the I.C. packages to the printed circuit board heat sinks. These posts also function to aid in the clamping of the sub-islands together by cooperating with a heat pipe hold down clamp by which each sub-island is clamped to the cooling frame heat pipes both mechanically and thermally to maximize the heat transfer between the I.C. packages and the heat pipes.

Utilization of heat pipes as part of the supporting carrier or frame provides a minimum temperature differential across the entire island and maintains the I.C. packages at a uniformly low temperature to maximize their operations. The condenser end of the heat pipes is arranged so that the cooling fins thereof extend outside the frame and into a plenum chamber through which ambient air is circulated.

As will be clear from a more detailed description in the description of the preferred embodiment, each sub-island is modular in that any selected sub-island can be connected or disconnected from the frame as a unit since the hold down pressure clamps hold the I.C. packages in the respective connectors even though the sub-islands are disconnected from the cooling frame. This permits the test, repair and/or replacement of a sub-island without disconnecting any other sub-island.

DESCRIPTION OF THE PREFERRED EMBODIMENT

Figure 1:
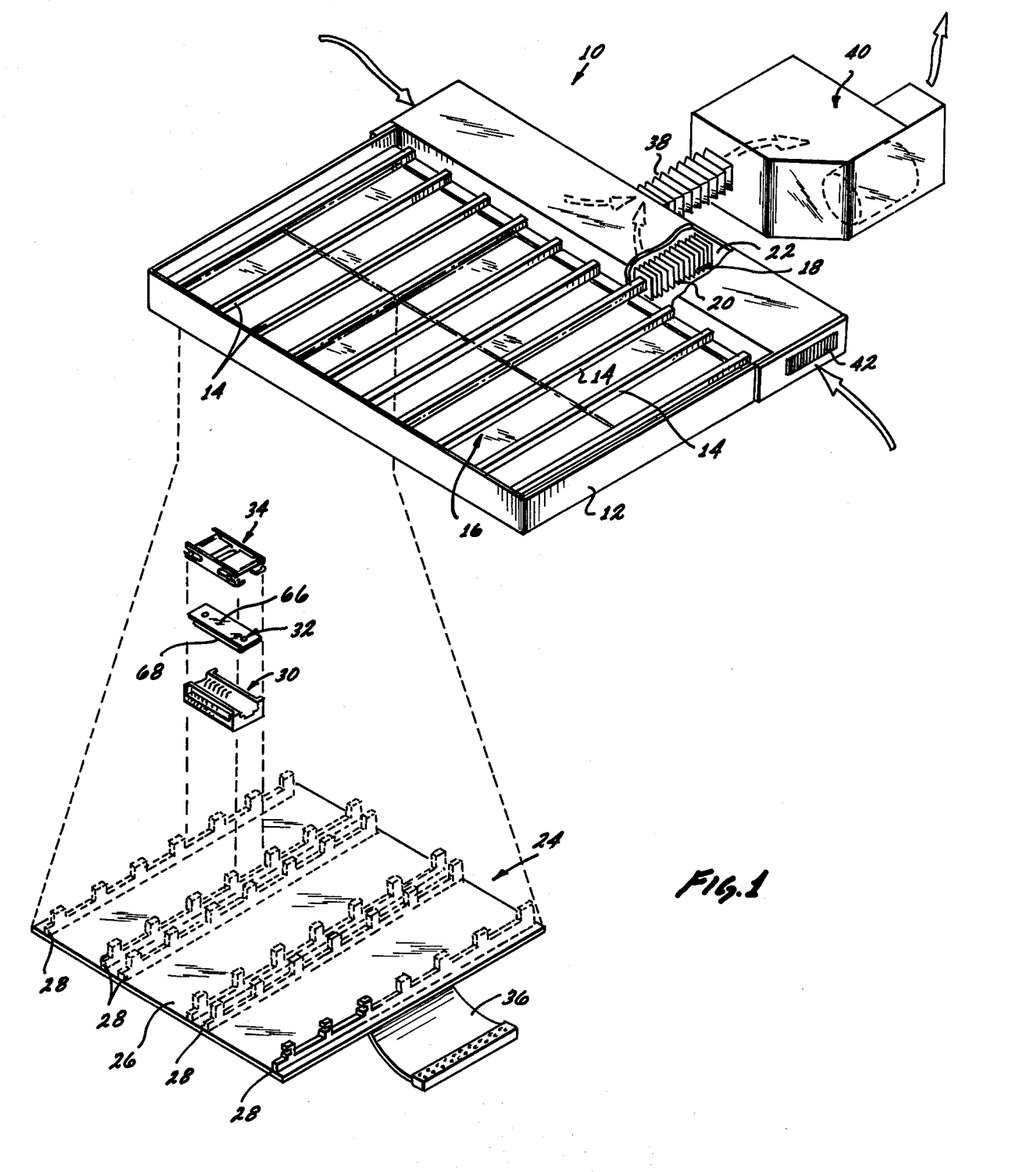
FIG. 1 is a perspective view, partially exploded and partially broken away, to show the details of the island; i.e., a sub-island, connectors, an integrated circuit package, and a heat pipe; and to show how the island cooperates with air cooling system.

Referring first to FIG. 1, it can be seen that the packaging system of the present invention comprises an island, indicated in its entirety as 10, which includes a cooling frame 12 having a plurality of heat pipes 14, with the evaporator portion 16 within the frame and with the condenser portion 18, the cooling fins 20 of which are located beyond the cooling frame and extending within a plenum chamber 22. Cooling frame 12 and heat pipes 14 together support a plurality of sub-islands 24 (6 shown); one of which has been removed from the cooling frame for purposes of clarity. The removed sub-island 24 includes an interconnect medium in the form of a p.c. board 26 on which are fastened a plurality of p.c. board heat sinks 28, between which are mounted a number of connectors 30 for receiving a plurality of I.C. packages 32 clamped into the connectors by an I.C. hold down pressure clamp 34. This combination makes each sub-island an integral separable unit interconnected to its adjacent sub-island by a ribbon-type, flexible cable and connector 36. The island 10 is connected to a source of cooling air by means of a duct 38 which connects the plenum chamber 22 to a motor and blower arrangement 40. Thus, air entering the plenum chamber 22 through openings 42 in the ends of the plenum chamber will pass over the heat pipe cooling fins 20 exiting out through duct 38 by reason of blower arrangement 40.

Figure 2:
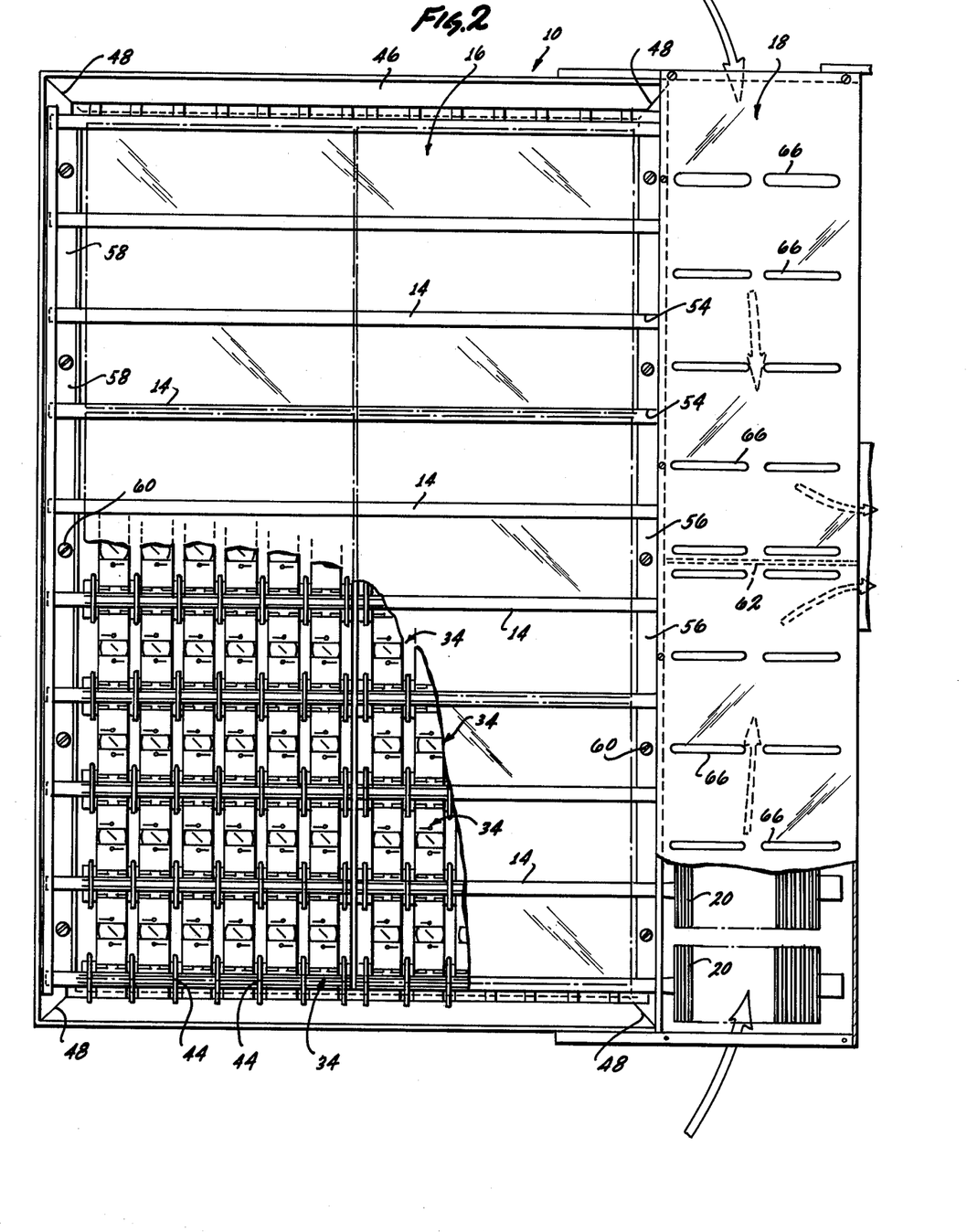
FIG. 2 is a plan view, partially broken away, of the island shown in FIG. 1 but also showing the sub-islands connected in the cooling frame in more detail.

Before explaining in more detail, but with reference to FIGS. 1 and 2, it should be pointed out that the I.C. packages 32, as shown, are preferably of the leadless type described in the referenced co-pending U.S. application and, in practice, by way of example eighteen connectors are mounted in each sub-island and for holding a pair of such I.C. packages clamped in the connectors by clamp 34 but, depending upon the application, larger islands may be employed. Each sub-island is rigidly and thermally connected to the heat pipes 14 by heat pipe hold down clamps 44 so that the heat generated by the I.C. packages 32 is dissipated by the operation of the heat pipes connect to maintain a minimum temperature differential across the entire island. The heat pipes utilize change of phase cooling and operate continuously with no moving parts and are therefore highly efficient and highly reliable.

Figure 5:
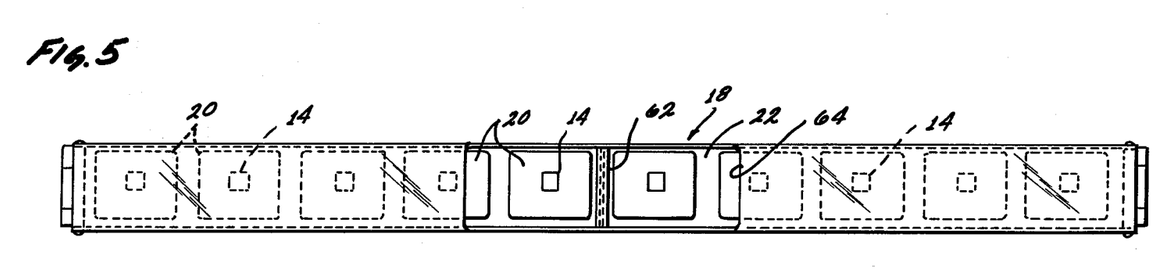
FIG. 5 is an end view showing the cooling fins of the heat pipes disposed of in the plenum chamber.
Figure 7:
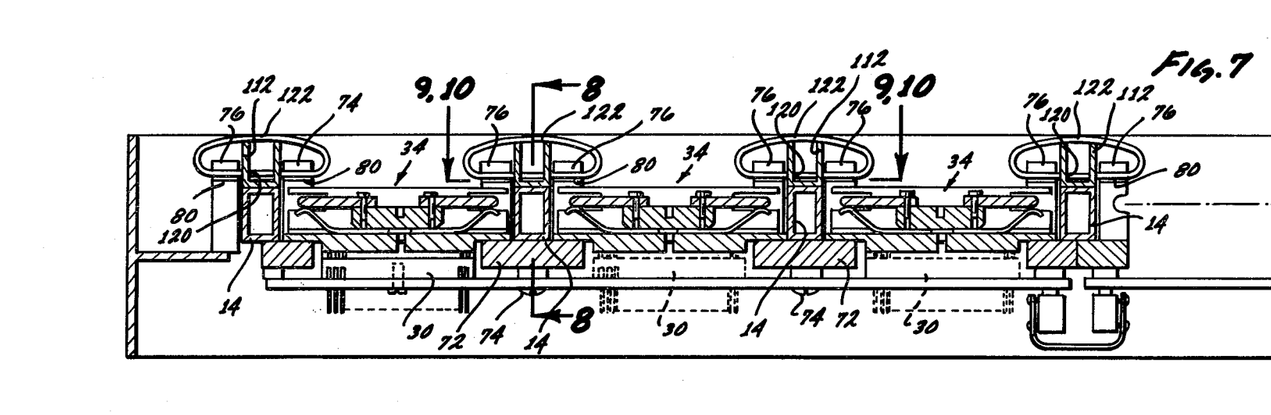
FIG. 7 is a cross sectional view of the cooling frame with one sub-island mounted herein together with a portion of a second sub-island to show the relationship between the two on the cooling frame.

Turning now to FIGS. 2, 5 and 7, it can be seen that the frame or supporting carrier 12 comprises selected lengths of metallic beams 46 of T-bar construction, mitered at the ends as shown in FIG. 2, at 48 fitted and bonded together to form a rectangular configuration with the legs 50 of the T-bars extending radially inwardly and bars 52 of the T forming the outer walls.

The bars 52 of the two longer lengths of the rectangle are provided with spaced-apart slots 54 more clearly shown in FIG. 2 for receiving the heat pipes 14. The legs of the heat pipes i.e. the evaporation portion 16 are placed in the slots and L-shaped bars 56 and 58 of a length substantially equal to the length of the long legs of the rectangle are placed over the ends of the heat pipe legs and fastened to the frame by a suitable means such as screws 60 for clamping the heat pipes into the frame. Thus, the basic frame 14 comprises a rectangle with the plurality of heat pipes 14 spanning the space between the long legs of the rectangle and parallel to the short side legs with the condenser portion 18 of the heat pipes extending beyond the edge of the frame.

Figure 6:
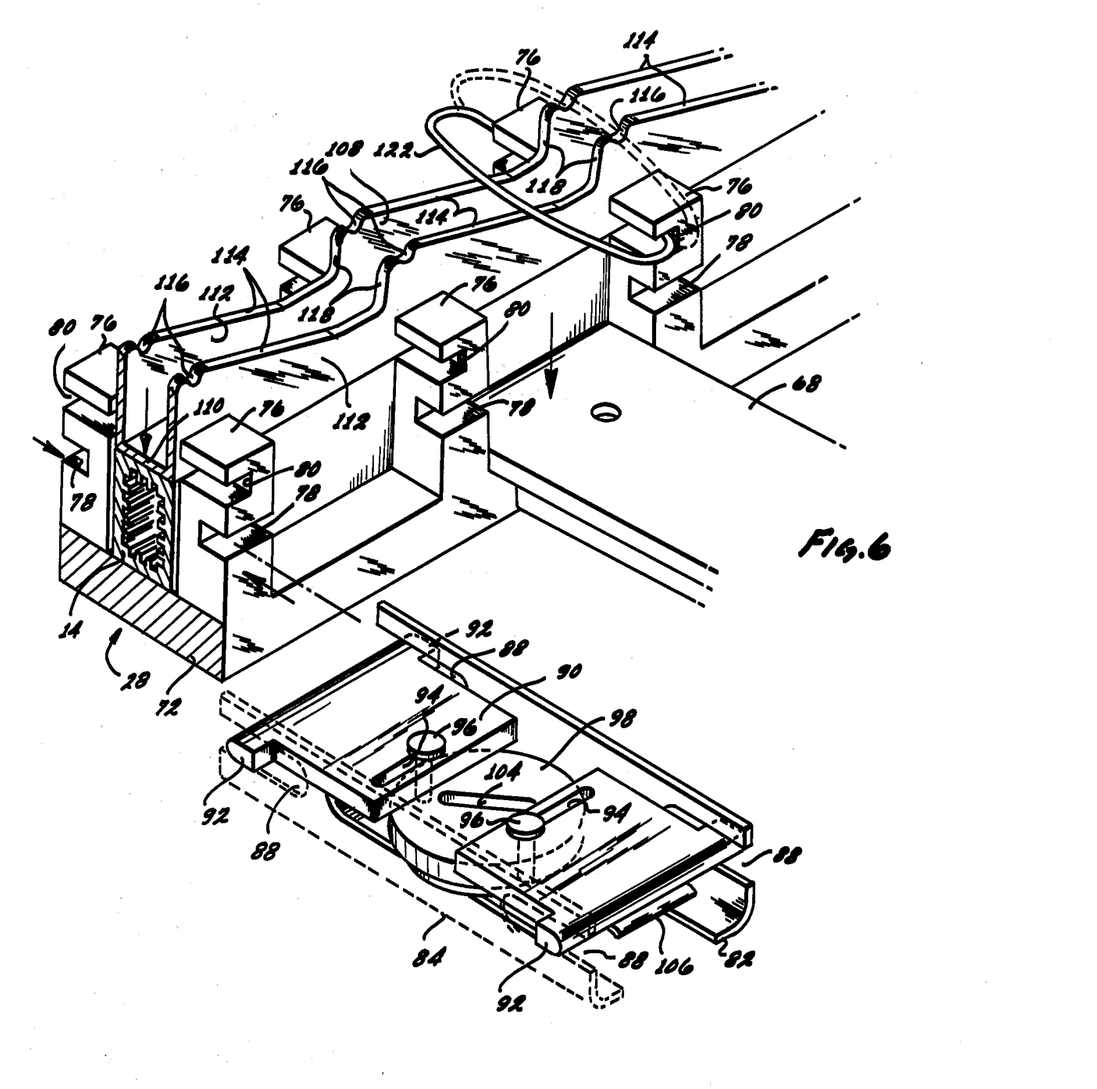
FIG. 6 is a perspective view showing the relationship of the I.C. hold down pressure clamp and heat pipe clamp relative to the heat pipe.

It can be seen from FIG. 2 that the heat pipes 14 are generally evenly distributed within the mid portion of the frame but two heat pipes are located near the short sides of the rectangle. This distribution accomodates the identical modular sub-islands 24 within the frame, six such sub-islands being shown in FIG. 2, and it should be further noted that the heat pipes of this invention comprise wickless elongated tubular members having flat sidewalls with internal serrations which act as a wick or capillary for the liquid thereon and, in general, heat is added to or, conversely, withdrawn from the p.c. board heat sink in the evaporation portions 16 and absorbed by the liquid located adjacent the sidewalls in the capillary structures where the liquid changes phase and, as a gas, is transported to the condensers or heat removal portions 18 where the vapor is cooled and returned to its liquid state and transported by capillary action back to the evaporator portions. The heat pipes disclosed have no discrete wicks but has preferably circumferential grooves in the tubular portion although longitudinal grooves are shown in FIG. 6. The circumferential grooves pump the coolant liquid against gravity and thus installation of an island is not as critical when gravity is not a factor to be considered.

As also shown in FIG. 2 and in FIG. 5, the plenum chamber 22 is provided with four side walls and divided by a center wall 62 and a centrally located outlet opening 64, which is in communication with a duct 38, for the egress of air. A suitable set of air conduits and a blower are connected to the outlet opening 64 to pull air through the openings 42 and past the fins of the heat pipes, and also through rectangular openings 66 distributed along the top wall of the plenum chamber. These openings 66 are smaller near the center of the chamber than near the inlet openings 42 to avoid an air short circuit near the outlet opening 64 and introduce a small amount of ambient air in the chamber to reduce any variation in the temperature rise through the plenum chamber itself. This center wall 62 effectively divides the plenum chamber into two sub-chambers so that the air entering the end openings 42 passes over a lesser number of heat pipes so that the path the air travels is shorter to reduce any variation in temperature from the inlet to the outlet.

While the foregoing description is of one island of six sub-islands and one plenum chamber, obviously a plurality of such islands could be aligned side-by-side and arranged in a single plenum chamber or each island could have an individual plenum chamber as the case may be. It should be also emphasized here that while modularity is an important concept in this invention, the heat pipe concept for cooling the I.C. packages is not limited thereby. That is to say, the heat pipes can be used with a large single board island such as used in the aforementioned patented system of the Braun et al. patent supra, if desired.

Figure 8:
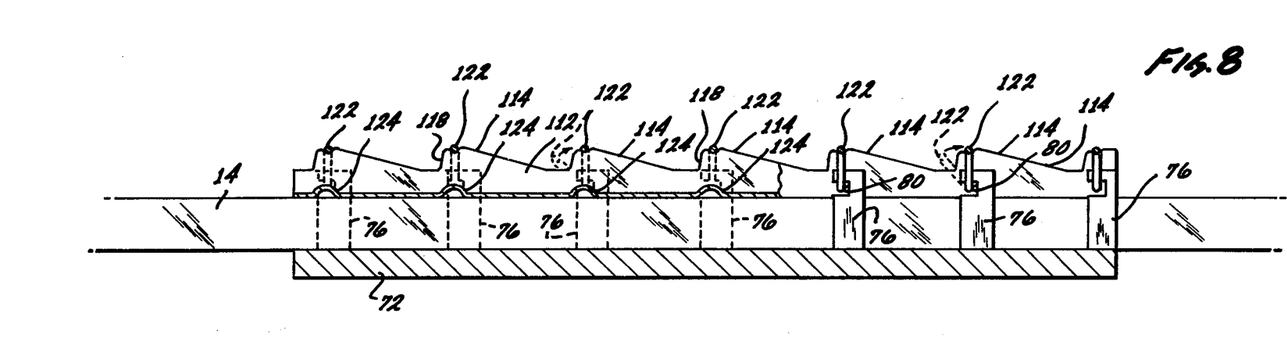
FIG. 8 is a cross-sectional view taken along line 8—8 of FIG. 7 and looking in the direction of the arrows, and showing the heat pipe hold down clamp in some detail.

Turning now to the make-up of the sub-islands, per se, attention is now directed to FIGS. 1 and 2 but particularly to FIGS. 6 – 8 where the manner of assembly of the sub-islands is shown in more detail.

Referring first, however, to the I.C. packages 32 and as more fully described in the co-pending Morse application and in the Braun et al. patent, supra, each I.C. package 32 may comprise a pair of leadless pluggable package components of either the LSI or MSI variety, each component having a plurality of leads and a ground connection in either a so-called split or single package configuration with a metallic heat sink 68 (FIG. 1) fused to the entire lower surface of the package substrate 70. The heat sink 68 has integral extensions which are adapted to be clamped against the p.c. board heat sink 28 (FIG. 6) in the direction of the arrow and in order to provide a ground connection, the package ground leads are connected to the heat sink which provides the electrical path to the cooling frame in addition to the thermal path.

Since this application is concerned with the means of cooling the I.C. package 32, more detail of the I.C. package than the I.C. package itself is not deemed necessary; however, reference can be made again to the co-pending Morse application supra, and the Braun et al. patent, supra, if further information is desired.

In order to make electrical contact with the I.C. package leads, a connector 30 as more clearly seen in FIG. 1 is provided. The connector 30 comprises a body of insulative material with a plurality of contacts, one for each of the package terminals. Each connector is fastened to the p.c. board 26 by any suitable means, such as by a screw, threaded through the p.c. board and into the connector or by the so-called solder tail connections as disclosed and claimed in the U.S. Pat. No. 3,999,826 of R. V. Hutchison and assigned to the same assignee. As explained in the Braun et al. patent, these connectors are provided with suitable contacts for contacting the leads of the I.C. package and means are provided for locating the packages in the connector and the connector to the p.c. board. The connector is, of course, held in electrical contact against conductive pads formed on the p.c. board, which pads are, in turn, connected to pins which protrude through the p.c. board and may be then electrically connected by suitable wiring means such as wire wrapped techniques or soldered to the p.c. board. Alternatively, the pins of the connector itself may be wire wrapped by the same technique as explained in the U.S. Patent to Hutchison U.S. Pat. No. 3,999,827 supra.

Again, since this invention is directed to the means of providing adequate cooling for the I.C. packages, the means of electrically connecting the I.C. package in the connectors and the connectors, in turn, to the p.c. board is only generally described. It should be pointed out, however, that it is important that the connectors 30 be laid side-by-side in rows as shown in FIG. 1 between the p.c. board heat sinks 28 which will now be described.

Each p.c. board heat sink member 28 comprises a relatively flat metallic flat base member or strip 72 extending the width of the p.c. board and itself having a width sufficient to receive the heat sink 68 of the I.C. packages and to fit between the connectors 30 lying side-by-side in rows. The heat sink member is fastened to the p.c. board in any suitable manner as screws 74, FIG. 7, and is further provided with a plurality of uprights or posts 76 spaced apart throughout the length of the base a distance sufficient to receive the heat sinks 68 and spaced from each other to receive the heat pipes 14 between the rows of posts as more clearly depicted in FIG. 6. In the embodiment shown, each p.c. board is provided with two such p.c. board heat sink members with two rows of posts generally centrally located and two half such members with a narrower strip and only one row of posts extending along the edges of the board so as to mate with a corresponding one-half heat sink member on an adjacently located p.c. board as the latter is placed in the covering frame.

Each post 76 extends upwardly a distance beyond the side walls of the heat pipe and are provided with suitable pairs of slots 78 and 80. Slots 78 are located a distance from the p.c. board to receive the I.C. package pressure clamp 34 for clamping the I.C. packages into the connectors, and the second pair of slots 80 for receiving the heat pipe hold down clamp 44 which clamps the sub-islands 24 as an assembly on the cooling frame 12.

Figure 9:
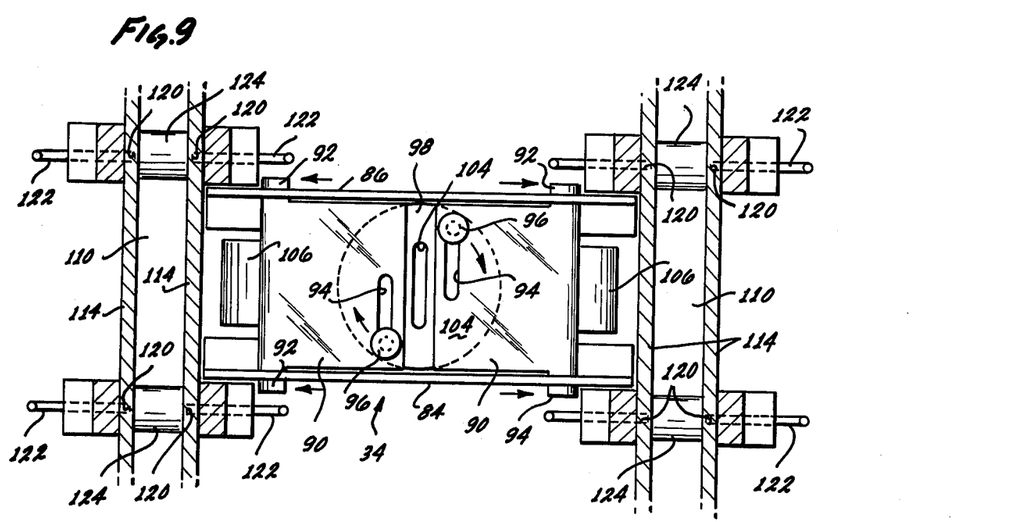
FIGS. 9 and 10 are planar views taken along lines 9/10—9/10 respectively of FIG. 7 and showing the package hold down pressure clamps for clamping the I.C. packages into the connectors, FIG. 9 showing the clamp in an unlatched position and FIG. 10 showing the clamp in a latched position.
Figure 10:
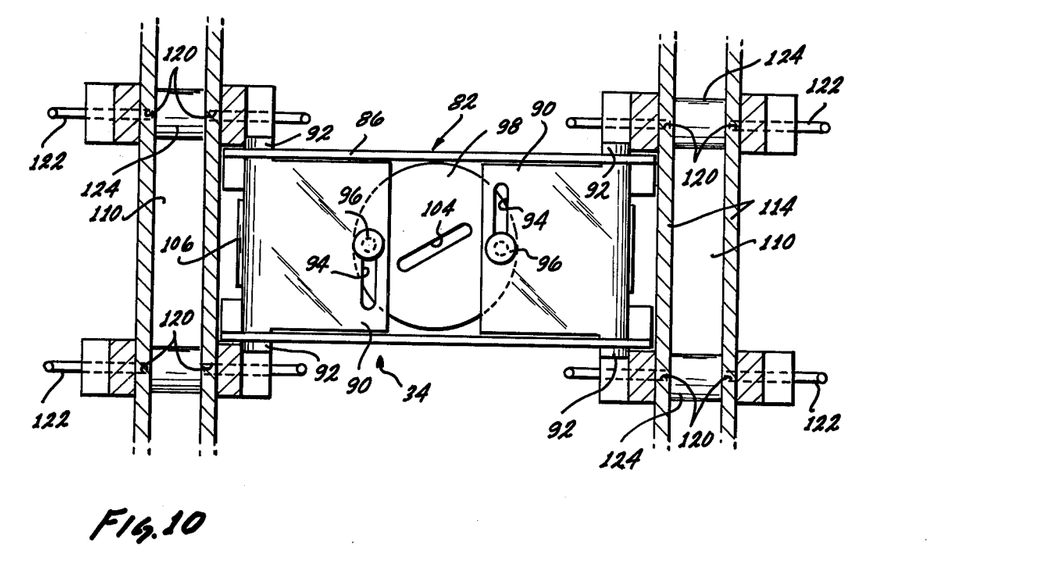
Figure 11:
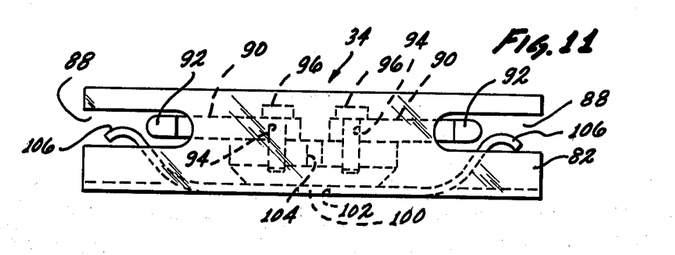
FIG. 11 is a side view of the I.C. hold down pressure clamp of FIGS. 9 and 10 shown in an unlatched position.

As best seen in FIGS. 6–9 the I.C. package pressure clamps 34 are shown in the relationship to the posts 76; FIG. 9 showing the pressure clamp in the unactuated position and FIG. 10 showing the clamp in the actuated position for clamping the I.C. packages 32 into the connectors 30. Each I.C. package pressure clamp 34 comprises a clamp latch body 82 of a length so to extend across the length of the connectors 30 and to engage the p.c. board heat sink strip 72. This clamp latch body 82 is U-shaped in cross section having upstanding sidewalls 84 and 86, the ends of which are each provided with horizontally extending open ended slots 88 (four shown) for receiving a pair of oppositely acting cam follows plates 90. Each cam following plate 90 is provided with a pair of outwardly extending lugs or ears 92 which extend beyond the upstanding sidewalls of the clamp latch body for engaging the slots 80 of adjacent posts 76 when the pressure clamp is in latched position. These cam follower plates 90 are shorter than the clamp latch body to permit lateral movement thereof and are each provided with a transverse slot 94 near their inner ends for receiving a cam pin 96 which is fixedly received in a disk cam 98. The disk cam 98 is itself fixed for rotation relative to the clamp latch body 82 by a centrally located pin 100 (FIG. 11) on an aperture 102 in the midportion of the latch body and is further provided with a transverse slot 104 centrally thereof for receiving a suitable tool, such as a screwdriver, for rotating the cam about the pivot pin 100 and thereby rotating the cam pins 96 for moving the cam follower plates outwardly so that the ears 92 will engage the slots 78 in the posts 76 and inwardly to disengage the ears from the slots as the case may be.

While it is important that the ears 92 of the cam follower plates engage the slots 78 in the posts, it is also perhaps even more important that the pressure clamps engage the tops of the I.C. packages so as to force the I.C. packages into their respective connectors to provide a good electrical connection between the packages and their connectors. To accomplish this, between the upright sidewalls, ends of the clamp latch body 82 are separated and curved separately to provide a pair of upwardly extending pressure plates or spring lugs 106 which resiliently engage the bottoms of the cam follower plates. These lugs are positioned in such a manner that when the cam follower plates press the bottom of the clamp latched body downwardly in spring pressurized relationship against the I.C. package. The pressure clamps are also arranged with respect to the cam follower plates so as to be released when the disk cam is rotated by the tool so as to retract the cam from the slots 78 which, in turn, releases the pressure on the I.C. packages permitting removal of the packages from the connectors, if desired.

From the description of the invention thus far, can be seen that each sub-island is modular and mechanically independent of other sub-islands. With the combination of the connectors and p.c. board heat sinks, the I.C. packages can be clamped by pressure by the I.C. package pressure clamps into the connectors and while a plurality of such clamps are needed, one for each I.C. package, each sub-island is independent of the cooling frame and can be attached thereto and removed therefrom independently of the other sub-islands. This modularity is important for repair, replacement, and testing of the various components of the island.

Having thus described a completely assembled sub-island, attention is now directed to the manner of mechanically and thermally connecting the sub-islands to the cooling frame, both mechanically to maximize the heat transfer between the I.C. packages and the heat pipes. Attention is now directed to FIGS. 6, 7 and 8. This heat pipe hold down clamp 44 comprises an elongated channel member 108 with a base 110 of width equal to the width of the top wall of the heat pipe to also span the distance between the rows of posts 76, and a pair of upright sidewalls 112 to form the U-shaped channel. Both sidewalls 112 are provided with a plurality of generally triangular-shaped ramps 114, the apex of which is formed with a small radius or notch 116, and which abruptly terminates to provide a slightly curved, almost vertical side wall 118. The sidewalls 112 are also blind apertured as at 120 immediately below but spaced therefrom, the notch 116 near the base 110 to receive the ends of a spring clamp toggle 122 generally elliptical in configuration and of a width to engage the notches 116 and to engage the slots 80 in the tops of the posts 76. As depicted clearly in FIGS. 6, 7 and 8 these spring toggles 122 pivot about the apertures 120 upwardly and springingly clamp the channel member tight against the top of the heat pipe 14 by reacting against slots 80 forcing the heat pipe downwardly and thus, in turn, forces the bottom wall of the heat pipe against the p.c. board heat sink 28 for good thermal conductivity. Furthermore, as best seen in FIG. 7 the base of the channel member is also provided with a plurality of small radii or bumps 124 located immediately below the notches 116 for the purposes of inserting a tool, such as a screwdriver, and resting the end there against to engage the spring toggle 122 and force it up into the notch 116 by rotating the toggle clockwise as reviewed in FIGS. 6 and 8 or conversely to engage the end of the tool to unclamp the spring toggle by moving in the same in a counterclockwise direction as indicated in FIGS. 6 and 8.

From the foregoing it can be seen that with a plurality of heat pipe hold down clamps with suitable toggles, one for each pair of posts, each sub-island can be mechanically and thermally connected to the cooling frame. The I.C. pressure clamps mechanically force the I.C. package heat sinks against the top of the p.c. board heat sinks between the posts for thermal conduction of the heat generated by the I.C. packages into the p.c. board heat sink and at the same time the heat pipe is pressureclamped tightly downwardly against the p.c. board heat sink for a maximum thermal conduction of the heat from the p.c. board heat sink into the heat pipe. This is represently clearly by the arrows in FIG. 6.

With this arrangement each modular of assembly is clamped into the cold frame from maximum thermal conduction. Heat generated by the I.C. packages is ultimately conducted therefrom by the operation of the heat pipes which transfers the heat to the fins in the plenum chamber where air entering the chamber and passing over the fins carries the heat out into the ambient air.

Figure 3:
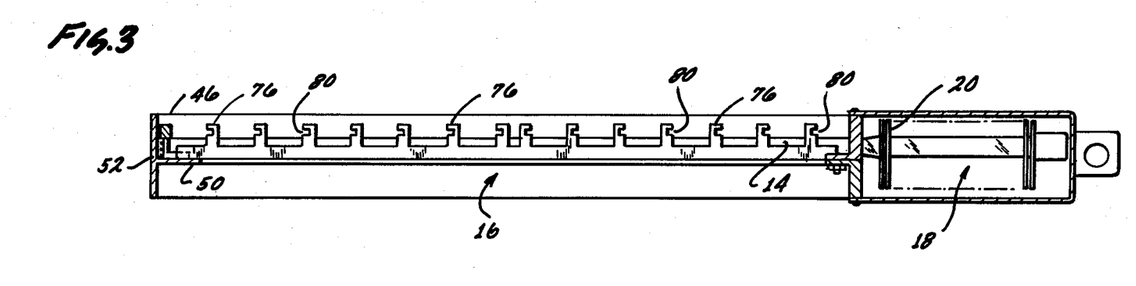
FIGS. 3 and 4 are cross sectional views of the cooling frame and heat pipes for an entire island — FIG. 3 showing a portion of the cooling frame and a heat pipe at the extreme outer end and FIG. 4 showing the heat pipe and frame located midway of the island — but both views shown without the sub-islands disposed in the cooling frame.
Figure 4:
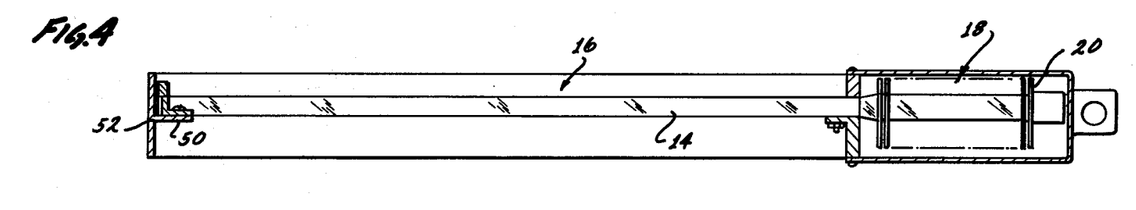

Returning again to FIGS. 1, 2, and 3, it can be seen that the cooling frame 12 will support six sub-islands 24. Since these sub-islands are identical with only one-half p.c. board heat sinks located adjacent the ends of the p.c. board, to accomodate the sub-islands near the short ends of the frame, each short end is also provided with a one-half p.c. board heat sink suitably attached, as by welding thereto. See particularly FIG. 3, This arrangement allows these one-half heat sinks near the end of the sub-island adjacent the short end of the frame to corporate through the heat pipe hold down clamps a clear showing of this arrangement can be seen in FIG. 7.

What is claimed is:

1. In a system for packaging and cooling electronic equipment, a sub-island comprising,
    a plurality of integrated circuit packages, each package having a plurality of electrical conductors and an integral heat sink member thereon,
    connector means for mounting said packages,
    an interconnection medium having a plurality of conductor leads,
    each of said connector means having a plurality of electrical contacts and being operatively connected in a predetermined relationship to said interconnection medium and providing respective electrical paths between said integrated circuit package electrical conductors and said interconnection medium conductor leads,
    interconnection medium heat sink means disposed in parallel spaced apart relationship transverse said interconnection medium for connecting said sub-island to a means for conducting heat from said integrated circuit package, and
    means for clamping said integrated circuit packages into said connector means and said package heat sink members into engagement with said interconnection medium heat sink means, so that heat generated by said packages is transferred to said interconnection medium heat sink means, said integrated circuit packages, interconnection medium, and clamping means thus forming an integral unit interconnected electrically and thermally.

2. The system claimed in claim 1 further including means for providing electrical connections with other similar sub-islands.

3. The system as claimed in claim 2 further including,
    a cooling frame for connecting said sub-island thereto,
    a plurality of heat pipes arranges in parallel spaced apart relationship within said frame, the evaporator portion of said heat pipes being adapted to engage said interconnection medium heat sink means when said sub-island is mounted on said frame, and
    means for clamping said sub-island to said heat pipes in mechanical and thermal relationship for the transfer of heat from said interconnection medium heat sink means to said heat pipes, said heat pipes further including a condensor portion for dissipating the heat generated by said integrated circuit packages.

4. The system as claimed in claim 3 further including a plenum chamber, said condensor portion of said heat pipes being disposed in said plenum chamber, and
means for circulating ambient air through said plenum chamber for cooling said condenser portions.

5. The system as claimed in claim 4 wherein said heat pipe members are provided with cooling fins on the condenser portion thereof.

6. The system as claimed in claim 5 wherein said interconnection medium heat sink means are provided with spaced apart posts, and
wherein said clamping means for said integrated circuit packages engage said posts for the clamping of said integrated circuit packages in said connector means.

7. The system as claimed in claim 6 wherein said means for clamping said sub-island engage said posts for clamping said sub-island into said frame.

8. The system as claimed in claim 7 wherein a plurality of such similar sub-islands are connected by said clamping means for said sub-island so as to form an island.

9. An assembly for packaging and cooling electronic equipment comprising at least one sub-island wherein
each sub-island includes a plurality of integrated circuit packages with heat sink means and mounted on a printed circuit board, each having interconnected conductive leads for receiving and sending input and output signals respectively,
a cooling frame including a plurality of heat pipes, and
means for thermally and mechanically connecting said heat sink means to said heat pipes for the thermal transfer of heat generated by said integrated circuit packages to said heat pipes so that said heat is dissipated by said heat pipes.

10. The assembly as claimed in claim 9, wherein the means for thermally and mechanically connecting said heat sink means to said heat pipes comprises a first clamping means for connecting said integrated circuit packages to said printed circuit board, and a second clamping means for connecting said sub-island to said heat pipes.

11. The assembly as claimed in claim 10, wherein each sub-island includes a plurality of connector means for engaging said interconnected conductive leads on said printed circuit board and for receiving said integrated circuit packages and providing an electrical connection between said packages and said interconnected conductive leads, and printed circuit board heat sink means mounted on said printed circuit board and arranged to engage said package heat sink means, and
wherein said first clamping means engages said printed circuit board heat sink means and forcibly clamps said packages into said connector means.

12. The assembly as claimed in claim 11 wherein said second clamping means engages said printed circuit board heat sink means for connecting each said sub-island to said heat pipes.

13. An assembly as claimed in claim 12, wherein each sub-island further includes means for electronically connecting with similar sub-islands for receiving and sending said input and output signals therethrough, and
wherein a plurality of such sub-islands mounted on said frame form an island.

14. The assembly as claimed in claim 13, wherein said heat pipes include an evaporator portion and a condenser portion, said evaporator portion engaging said printed circuit board heat sink means for the transfer of heat generated by said packages to said condenser portion.

15. The assembly as claimed in claim 14, further including a plenum chamber, said condenser portions of said heat pipes being located in said plenum chamber, and
means for circulating air through said plenum chamber for cooling said condenser portions.

16. Means for cooling electronic equipment, which equipment includes integrated circuit packages with heat sink means disposed to dissipate the heat generated by said integrated circuit packages during operation thereof, and
heat pipe means in thermal conductive relationship with said heat sink means for dissipating the heat in said heat sink means.

* * * * *